(12) United States Patent
Motoori (10) Patent No.: US 10,196,214 B2
(45) Date of Patent: Feb. 5, 2019

(54) CONVEYOR CAR SYSTEM

(71) Applicant: Murata Machinery, Ltd., Kyoto-shi, Kyoto (JP)

(72) Inventor: Yoichi Motoori, Inuyama (JP)

(73) Assignee: MURATA MACHINERY, LTD., Minami-Ku, Kyoto-Shi, Kyoto (JP)

( * ) Notice: Subject to any disclaimer, the term of this patent is extended or adjusted under 35 U.S.C. 154(b) by 0 days.

(21) Appl. No.: 15/750,807

(22) PCT Filed: Jun. 17, 2016

(86) PCT No.: PCT/JP2016/068137
§ 371 (c)(1),
(2) Date: Feb. 6, 2018

(87) PCT Pub. No.: WO2017/029873
PCT Pub. Date: Feb. 23, 2017

(65) Prior Publication Data
US 2018/0229936 A1    Aug. 16, 2018

(30) Foreign Application Priority Data

Aug. 14, 2015  (JP) .................. 2015-160168

(51) Int. Cl.
*B61B 3/02* (2006.01)
*B65G 1/00* (2006.01)
*B65G 1/06* (2006.01)
*G05D 1/02* (2006.01)
(Continued)

(52) U.S. Cl.
CPC ............... *B65G 17/20* (2013.01); *B61B 3/02* (2013.01); *B65G 1/00* (2013.01); *B65G 1/065* (2013.01);
(Continued)

(58) Field of Classification Search
CPC .. B61B 3/02; B61B 1/005; B65G 1/00; B65G 1/04; B65G 2201/0297; B65G 1/065;
(Continued)

(56) References Cited

U.S. PATENT DOCUMENTS 5,842,917 A * 12/1998 Soung ............... H01L 21/67727
454/187
6,089,811 A * 7/2000 Watanabe ............. B23P 21/004
198/347.3
(Continued)

FOREIGN PATENT DOCUMENTS

| JP | 2006-224944 A | 8/2006 |
|---|---|---|
| JP | 2012-066933 A | 3/2012 |
| JP | 5369560 B | 9/2013 |
| WO | 2011/065146 A1 | 6/2011 |

OTHER PUBLICATIONS

International Preliminary Report on Patentability for related PCT Application No. PCT/JP2016/068137 dated Feb. 20, 2018; 9 pages.

Primary Examiner — Mark A Deuble
(74) Attorney, Agent, or Firm — Procopio, Cory, Hargreaves & Savitch LLP (57) ABSTRACT

A transport vehicle system includes: a first transport vehicle configured to travel on a lower track in one direction; a second transport vehicle configured to travel on an upper track in one direction; a first transfer section onto which a conveyed object is delivered from the second transport vehicle and from which the conveyed object is received by the first transport vehicle; and a second transfer section onto which the conveyed object is delivered from the first transport vehicle and from which the conveyed object is received by the second transport vehicle.

16 Claims, 8 Drawing Sheets

(51) Int. Cl.
*B65G 17/20* (2006.01)
*B65G 37/02* (2006.01)
*H01L 21/677* (2006.01)

(52) U.S. Cl.
CPC ............... *B65G 37/02* (2013.01); *G05D 1/02* (2013.01); *H01L 21/677* (2013.01); *B65G 2201/0297* (2013.01)

(58) Field of Classification Search
CPC ........ B65G 37/02; G05D 1/02; H01L 21/677; H01L 21/67706; H01L 21/67733; H01L 21/67754; H01L 21/67757; B54G 1/06
See application file for complete search history.

(56) References Cited

U.S. PATENT DOCUMENTS

| | | | |
|---|---|---|---|
| 7,261,510 B2 * | 8/2007 | Motoori | B65G 37/02 414/281 |
| 8,322,287 B2 * | 12/2012 | Oguro | B65G 37/02 104/88.01 |
| 2004/0191030 A1 * | 9/2004 | Rice | B65G 17/20 414/222.01 |
| 2006/0182553 A1 | 8/2006 | Yamamoto et al. | |
| 2007/0157878 A1 * | 7/2007 | Aoki | H01L 21/67276 118/500 |
| 2010/0215461 A1 * | 8/2010 | Kamikawa | H01L 21/67727 414/222.13 |
| 2012/0076623 A1 | 3/2012 | Kasuya | |
| 2015/0329298 A1 * | 11/2015 | Ito | B65G 1/0464 414/222.07 |
| 2017/0283182 A1 * | 10/2017 | Maejima | B65G 35/08 |

* cited by examiner

CONVEYOR CAR SYSTEM

CROSS-REFERENCE TO RELATED APPLICATIONS

This application is a U.S. National Stage entry of PCT Application No: PCT/JP2016/068137 filed Jun. 17, 2016, which claims priority to Japanese Patent Application No. 2015-160168, filed Aug. 14, 2015, the contents of which are incorporated herein by reference.

TECHNICAL FIELD

The example implementation(s) relates to a transport vehicle system.

RELATED ART

Related art transport vehicle systems are configured to cause transport vehicles to travel along a track installed on a ceiling to convey articles. For example, in a transport vehicle system used to convey articles in a semiconductor factory and the like, a track (intra-bay route) circling in each of a plurality of areas (intra-bays) in which processing devices configured to perform the same or similar processing is disposed, and a second track (inter-bay route) is arranged, connecting between the areas. When a transport vehicle conveys an article from one area to another area, the transport vehicle travels from the intra-bay route in the one area via the inter-bay route, and enters the intra-bay route in the other area as a destination.

In recent years, with upsizing of semiconductor factories, the amount of conveyance has been increasing. In other words, the number of transport vehicles has been increasing in both of the intra-bay routes and inter-bay routes. In a transport vehicle system configured as described above, for example, due to difference between processing capabilities (throughputs) of processing devices in each area, an increasing number of transport vehicles increases the density of transport vehicles in an area of high throughput. Consequently, congestion of transport vehicles at an entrance from an inter-bay route to an intra-bay route or in the intra-bay route may become chronic.

For example, a transport vehicle system is described in Patent Literature 1 as a transport vehicle system designed to improve conveying capability in an area. In addition to a traveling track for a first transport vehicle configured to travel both an intra-bay route and an inter-bay route, a traveling track for a second transport vehicle is locally arranged near processing devices with high throughput, articles are transferred between the first transport vehicle and the second transport vehicle via a buffer, and the second transport vehicle is configured to transfer the articles between the buffer and facilities. In this transport vehicle system, the second transport vehicle is locally arranged for the processing devices with high throughput as described above, whereby conveying capability can be locally improved.

CITATION LIST

Patent Literature

[Patent Literature 1] Japanese Unexamined Patent Publication No. 2006-224944

SUMMARY OF INVENTION

Technical Problem

However, in the related art system described above, to deliver an article from the first transport vehicle to the second transport vehicle, the first transport vehicle is required to enter the intra-bay route from the inter-bay route. Consequently, an increasing amount of conveyance increases the density of transport vehicles in an area, and consequently may cause congestion. Thus, sufficient improvement of conveying capability in the whole area cannot be achieved.

In view of this, it is an object of one aspect of the example implementation(s) to provide a transport vehicle system that can improve conveying capability and relieve congestion of transport vehicles.

Solution to Problem

A transport vehicle system according to one aspect of the example implementation(s) includes: a first track forming a circuit track that circles in an area being one of a plurality of areas; a first transport vehicle configured to travel on the first track in one direction; a second track connecting between the areas; a second transport vehicle configured to travel on the second track in one direction; a first transfer section onto which a conveyed object is delivered from the second transport vehicle and from which the conveyed object is received by the first transport vehicle; and a second transfer section onto which the conveyed object is delivered from the first transport vehicle and from which the conveyed object is received by the second transport vehicle. The area has a first region and a second region; the first track is arranged across the first region and the second region, and the first transfer section and the second transfer section are arranged in the first region. A third transfer section in which the conveyed object can be transferred to or from the first transport vehicle is arranged in the second region. The first track in the first region is arranged such that the first transport vehicle passes by the second transfer section and the first transfer section in this order, in a traveling direction of the first transport vehicle. The second track in the first region is arranged such that the second transport vehicle passes by the first transfer section and the second transfer section in this order, in a traveling direction of the second transport vehicle.

With the transport vehicle system thus configured, the first transport vehicle can be used for conveyance within an area and the second transport vehicle can be used for conveyance between areas. Thus, a situation in which the first transport vehicle travels between areas and the second transport vehicle travels within an area can be prevented. In other words, the respective roles of the first transport vehicle and the second transport vehicle can be divided, whereby the number of first transport vehicles traveling in the area can be always kept constant without being increased or reduced. This enables the transport vehicles to efficiently travel, and thus congestion can be relieved.

During traveling on the first track in the one direction, the first transport vehicle receives a conveyed object from the second transport vehicle in the first transfer section, delivers the conveyed object in the third transfer section, also receives a conveyed object in the third transfer section, and delivers the conveyed object to the second transport vehicle in the second transfer section. Similarly, during traveling on the second track in the one direction, the second transport vehicle delivers a conveyed object to the first transport vehicle in the first transfer section, and receives the conveyed object from the first transport vehicle in the second transfer section. During a series of traveling processes, the first transport vehicle and the second transport vehicle repeat operations of receiving a conveyed object and delivering the conveyed object as described above, which enables efficient conveyance for the first transport vehicle and the second transport vehicle. Consequently, conveying capability can be improved, and congestion of transport vehicles can be relieved.

In one implementation, the third transfer section may be arranged between the first transfer section and the second transfer section in a direction extending along the first track.

In the transport vehicle system thus configured, during traveling on the first track in the one direction, the first transport vehicle receives a conveyed object from the second transport vehicle in the first transfer section, delivers the conveyed object in the third transfer section, also receives a conveyed object in the third transfer section, and delivers the conveyed object to the second transport vehicle in the second transfer section. During a series of traveling processes, the first transport vehicle can repeat operations of receiving a conveyed object and delivering the conveyed object, which enables efficient conveyance for the first transport vehicle.

In one implementation, in the first transfer section and/or the second transfer section, the conveyed object may be transferred between the first transport vehicle and the second transport vehicle respectively traveling on the first track and the second track that are arranged parallel to each other. The term "parallel" herein includes being substantially parallel.

In the transport vehicle system thus configured, the first transfer section and/or the second transfer section in which a conveyed object can be transferred from the first transport vehicle and the second transport vehicle can be easily arranged.

In one implementation, the first transport vehicle and the second transport vehicle may respectively travel in the same direction on the first track and the second track that are arranged parallel to each other. The term "parallel" herein includes being substantially parallel.

In one implementation, the first transfer section and/or the second transfer section may be arranged below one of the first track and the second track, and beside the other of the first track and the second track.

With the transport vehicle system thus configured, space for an area in which the transport vehicle system is installed can be reduced. The first transport vehicle and/or the second transport vehicle configured to transfer a conveyed object to the first transfer section and/or the second transfer section can transfer the conveyed object by simple control of performing only one of raising/lowering of a hoist carriage and laterally feeding of the hoist carriage. Thus, a time required for transferring the conveyed object can be shortened. Furthermore, a transport vehicle that does not include a laterally feeding mechanism can be used as the first transport vehicle or the second transport vehicle.

In one implementation, the first transfer section and/or the second transfer section may be arranged below the second track and beside the first track.

In one implementation, a plurality of first placement sections may be arranged in the first transfer section, the second transport vehicle may deliver the conveyed object on a priority basis to one of the first placement sections that is arranged upstream in the one direction, and the first transport vehicle may receive the conveyed object on a priority basis from one of the first placement sections that is arranged upstream in the one direction.

With the transport vehicle system thus configured, the second transport vehicle can deliver a conveyed object to the first transfer section earlier, and the first transport vehicle can receive the conveyed object from the first transfer section earlier. Consequently, the second transport vehicle has an increasing chance of delivering the conveyed object and the first transport vehicle has an increasing chance of receiving the conveyed object. Thus, the conveyed object can be efficiently transferred from the second transport vehicle to the first transport vehicle.

In one implementation, a plurality of second placement sections may be arranged in the second transfer section, the first transport vehicle may deliver the conveyed object on a priority basis to one of the second placement sections that is arranged upstream in the one direction, and the second transport vehicle may receive the conveyed object on a priority basis from one of the second placement sections that is arranged upstream in the one direction.

With the transport vehicle system thus configured, the first transport vehicle can deliver the conveyed object to the second transfer section earlier, and the second transport vehicle can receive the conveyed object from the second transfer section earlier. Consequently, the first transport vehicle has an increasing chance of delivering the conveyed object, and the second transport vehicle has an increasing chance of receiving the conveyed object. Thus, the conveyed object can be efficiently transferred from the first transport vehicle to the second transport vehicle.

In one implementation, in the second region, processing devices configured to perform identical or similar processes may be arranged along the first track, and the conveyed object may be transferred between the first transport vehicle and each processing device via the third transfer section.

With the transport vehicle system thus configured, a transport vehicle system that can be adapted to a bay-type configuration can be provided.

Advantageous Effects of Invention

According to one aspect of the example implementation(s), conveying capability can be improved and congestion of transport vehicles can be relieved.

DESCRIPTION OF IMPLEMENTATIONS

One implementation will now be described with reference to the drawings. In the description of the drawings, like elements are designated by like reference signs, and duplicated explanation is omitted.

Figure 1:
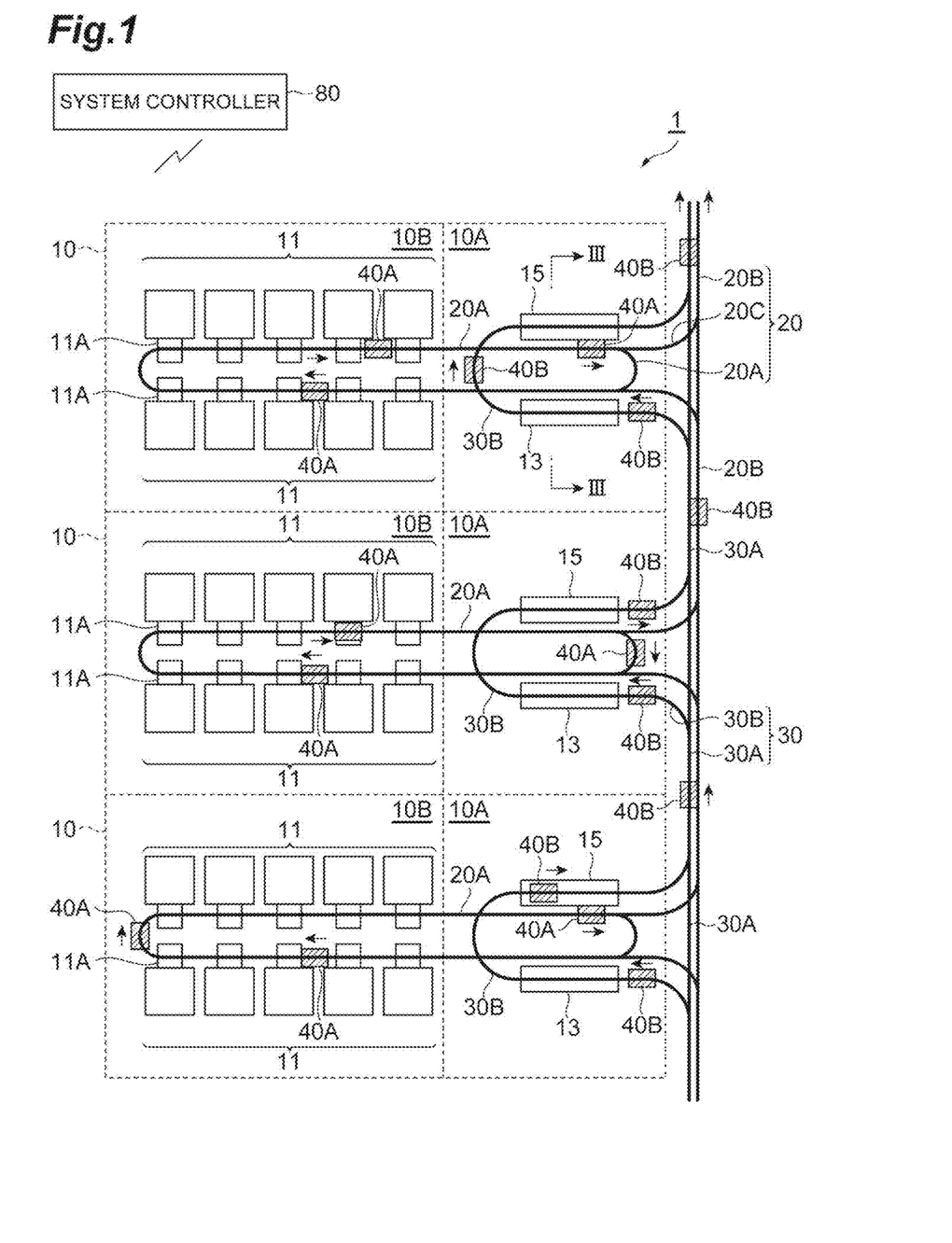
FIG. 1 is a configuration diagram illustrating a configuration of a transport vehicle system according to one implementation.

As depicted in FIG. 1, a transport vehicle system 1 is a system configured to convey conveyed objects F (see FIG. 3, for example) between areas 10 in each of which a plurality of processing devices 11 configured to perform the same or similar processes is disposed, using first transport vehicles 40A and second transport vehicles 40B that can move along tracks.

Examples of the conveyed objects F include a front opening unified pod (FOUP). Herein, for example, the transport vehicle system 1 will be described as one example in a semiconductor factory and the like, in which the first transport vehicles 40A and the second transport vehicles 40B travel along one-way tracks installed on a ceiling, for example, of the factory.

As depicted in FIG. 1, the transport vehicle system 1 mainly includes a lower track (first track) 20, the first transport vehicles 40A configured to travel on the lower track 20 in one direction, third transfer sections 11A, an upper track (second track) 30 installed above the lower track 20, the second transport vehicles 40B configured to travel on the upper track 30 in one direction, first transfer sections 13, second transfer sections 15, and a system controller 80. The area 10 includes: a first region 10A in which the corresponding first transfer section 13 and the corresponding second transfer section 15 are arranged; and a second region 10B in which the corresponding processing devices 11 and the corresponding third transfer sections 11A are arranged.

The lower track 20 includes lower intra-bay routes 20A, a lower inter-bay route 20B, and connecting routes 20C. Each lower intra-bay route 20A is a track arranged in the corresponding area 10 and circling in one direction. The processing devices 11 disposed in the area 10 are arranged along the lower intra-bay route 20A. The lower inter-bay route 20B is a track that connects lower intra-bay routes 20A arranged in different areas 10 to each other. Each connecting route 20C is a track that connects the corresponding lower intra-bay route 20A and the lower inter-bay route 20B.

A plurality of the first transport vehicles 40A travel on the lower track 20. Each lower intra-bay route 20A is arranged across the corresponding first region 10A and the corresponding second region 10B. In the traveling direction in which first transport vehicles 40A travel on the lower intra-bay route 20A, the corresponding second transfer section 15 is arranged upstream of the corresponding first transfer section 13. In other words, the lower intra-bay route 20A in the first region 10A is arranged such that the first transport vehicles 40A pass by the second transfer section 15 and the first transfer section 13 in this order in the traveling direction thereof.

Each third transfer section 11A is a port in which a conveyed object F is transferred between a processing device 11 and a first transport vehicle 40A. The third transfer section 11A is arranged in front of each of the processing devices 11.

The upper track 30 is a track arranged above the lower track 20, and includes an upper inter-bay route 30A and approach sections 30B. The upper inter-bay route 30A is a track that connects between areas 10. Each approach section 30B is a track that diverges from the upper inter-bay route 30A, merges into part of the first region 10A in the corresponding area 10, and returns back to the upper inter-bay route 30A.

A plurality of the second transport vehicles 40B travel on the upper track 30. In the traveling direction in which second transport vehicles 40B travel on the approach section 30B, the corresponding first transfer section 13 is arranged upstream of the corresponding second transfer section 15. In other words, the approach section 30B in the first region 10A is arranged such that the second transport vehicles 40B pass by the first transfer section 13 and the second transfer section 15 in this order in the traveling direction thereof.

Although details will be described later, when conveyed objects F are conveyed between areas, the conveyance is performed as a general rule by second transport vehicles 40B traveling on the upper inter-bay route 30A (e.g., outside a time of emergency). The lower inter-bay route 20B is not used during normal conveyance as a general rule, and is used in a time of emergency, for example, when the upper inter-bay route 30A cannot be used. In this manner, during normal conveyance, the lower track 20 and the upper track 30 are respectively used for intra-bay conveyance and for inter-bay conveyance, and thus congestion in intra-bay routes can be relieved.

Figure 2:
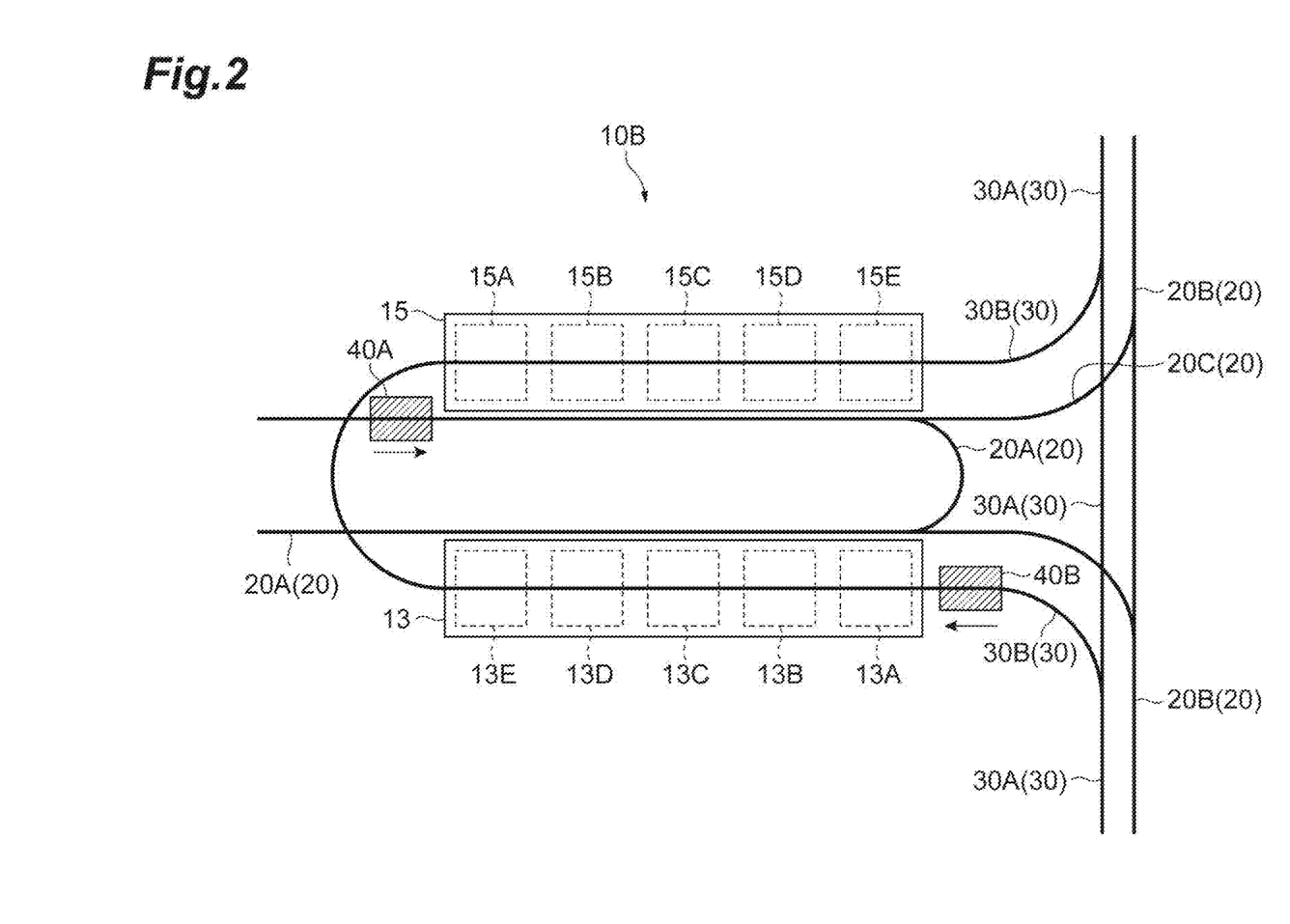
FIG. 2 is a plan view illustrating a partial configuration of the transport vehicle system in FIG. 1 in an enlarged manner.

Although the upper inter-bay route 30A is arranged above the lower inter-bay route 20B, the lower inter-bay route 20B and the upper inter-bay route 30A are illustrated side by side in FIG. 1 and FIG. 2 (on the right in FIG. 1 and FIG. 2) for convenience in description.

Figure 3:
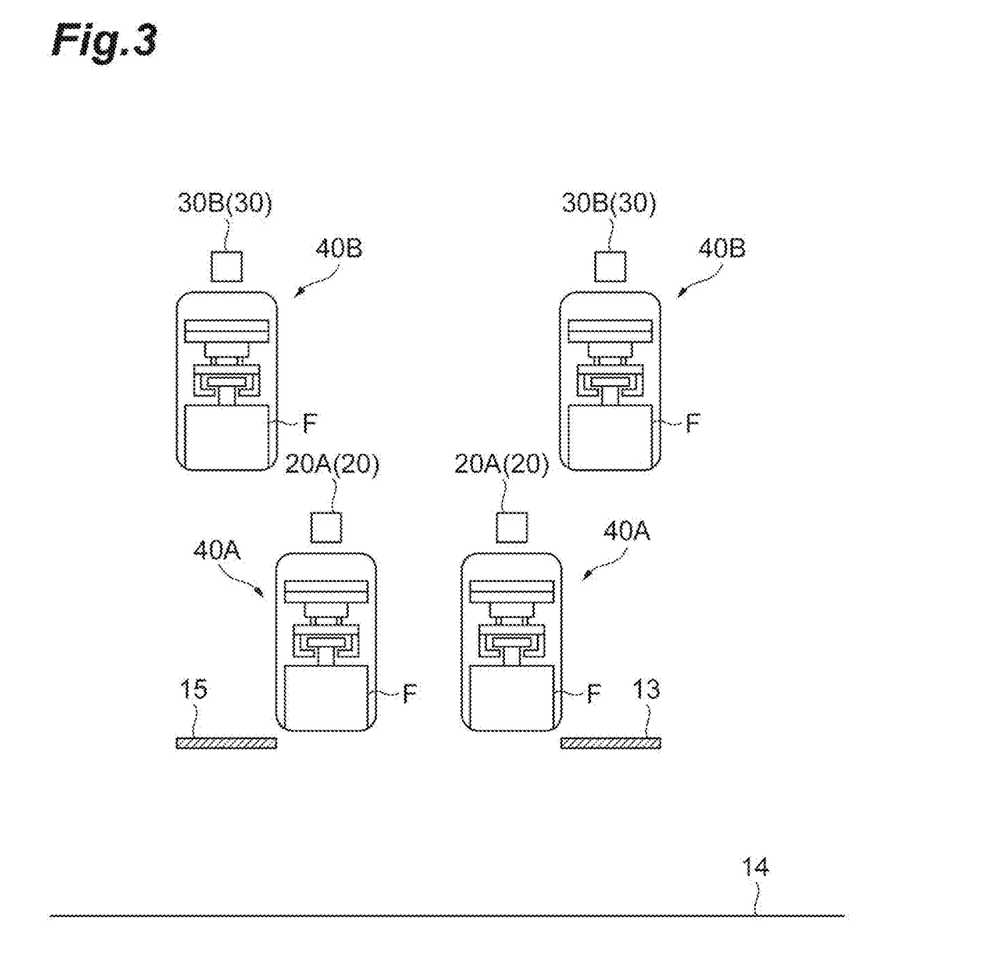
FIG. 3 is a front view when viewed from the line III-III in FIG. 1.

Each first transfer section 13 is a port onto which a conveyed object F is delivered from a second transport vehicle 40B and from which the conveyed object F is received by a first transport vehicle 40A. The first transfer section 13 is suspended with a suspending member from a ceiling (not depicted). In other words, as depicted in FIG. 3, the first transfer section 13 is provided at a position separated from a floor 14. In the first transfer section 13, a conveyed object F is transferred between a first transport vehicle 40A and a second transport vehicle 40B that travel respectively on the lower intra-bay route 20A and the approach section 30B when viewed in plan view.

As depicted in FIG. 2, in the first transfer section 13, a plurality of (five in the present implementation) first placement sections 13A to 13E are arranged along one direction (the traveling direction of second transport vehicles 40B). A second transport vehicle 40B that travels on the approach section 30B to enter the area 10 delivers a conveyed object F on a priority basis to the first placement section 13A that is arranged upstream in the one direction. A first transport vehicle 40A receives a conveyed object F on a priority basis from the first placement section 13A that is arranged upstream in the one direction.

As depicted in FIG. 3, the first transfer section 13 is arranged below the second transport vehicle 40B traveling on the approach section 30B, and is arranged beside the first transport vehicle 40A traveling on the lower intra-bay route 20A. Herein, the first transport vehicle 40A and the second transport vehicle 40B travel in the same direction respectively on the lower intra-bay route 20A and the approach section 30B that are arranged parallel to each other, when viewed in a plan view.

Figure 4:
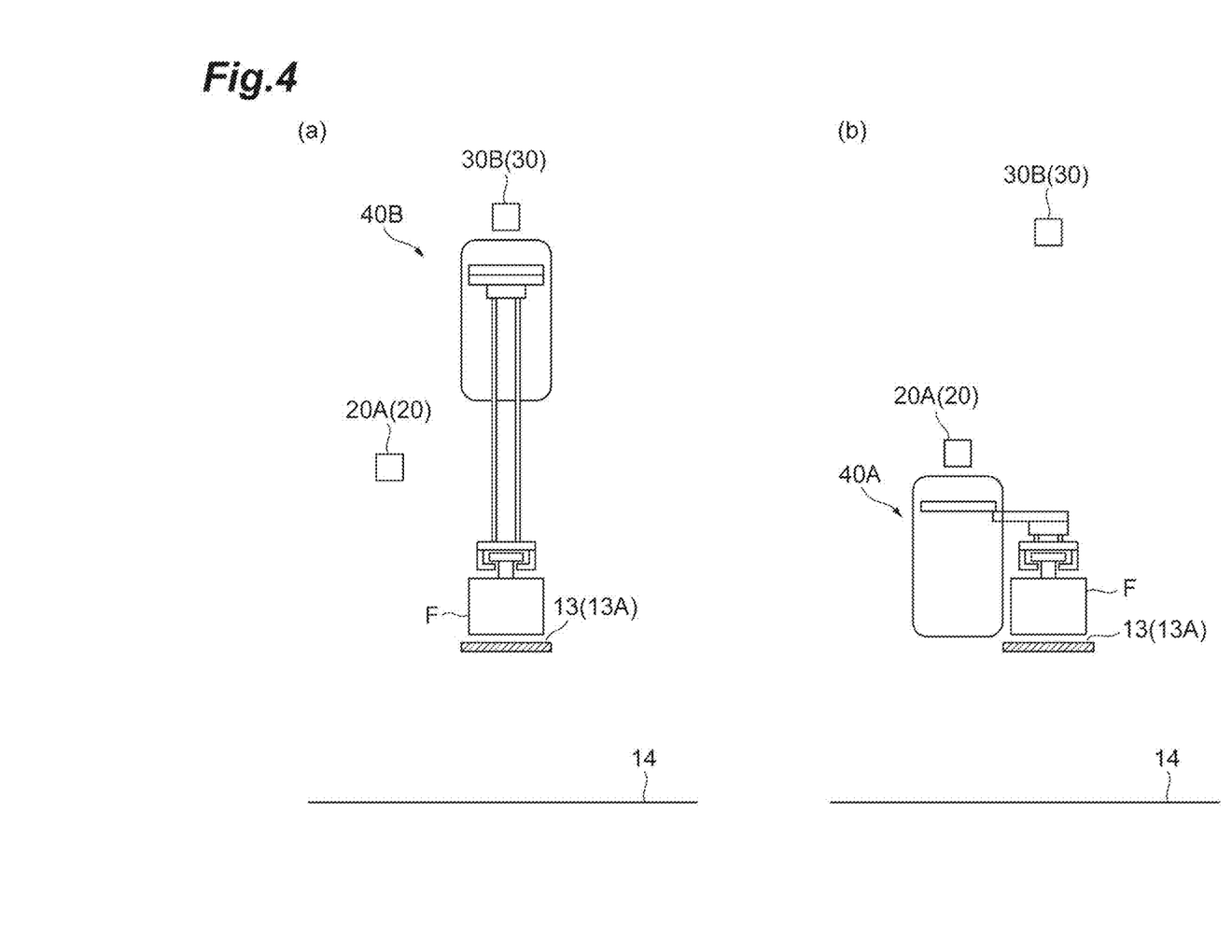
FIG. 4(a) is a front view illustrating a method for transferring a conveyed object in a first transfer section performed by a second transport vehicle.
FIG. 4(b) is a front view illustrating a method for transferring a conveyed object in the first transfer section performed by a first transport vehicle.

The following describes a method for transferring a conveyed object F from a second transport vehicle 40B to a first transport vehicle 40A. Specifically, as depicted in FIG. 4(a), a second transport vehicle 40B traveling on the approach section 30B stops above the first transfer section 13 (e.g., the first placement section 13A). The second transport vehicle 40B drives a hoist drive unit 43 described later in detail to place a conveyed object F onto the first placement section 13A. The foregoing operation completes delivery of the conveyed object from the second transport vehicle 40B to the first transfer section 13.

Subsequently, as depicted in FIG. 4(b), a first transport vehicle 40A traveling on the lower intra-bay route 20A stops beside the first transfer section 13 (e.g., the first placement section 13A). The first transport vehicle 40A drives a lateral drive 41 and a hoist drive unit 43 described later in detail (see FIG. 6) to receive the conveyed object F from the first placement section 13A. This completes delivery of the conveyed object F from the first transfer section 13 to the first transport vehicle 40A. In other words, delivery of the conveyed object F from the second transport vehicle 40B to the first transport vehicle 40A is completed.

Referring back to FIG. 1, each second transfer section 15 is a port onto which a conveyed object F is delivered from a first transport vehicle 40A and from which the conveyed object F is received by the second transport vehicle 40B. The second transfer section 15 is suspended with a suspending member from the ceiling (not depicted). In other words, as depicted in FIG. 3, the second transfer section 15 is provided at a position separated from the floor 14. In the second transfer section 15, a conveyed object F is transferred between a first transport vehicle 40A and a second transport vehicle 40B that travel respectively on the lower intra-bay route 20A and the approach section 30B that are arranged parallel to each other, when viewed in plan view.

As depicted in FIG. 2, in the second transfer section 15, a plurality of (e.g., five in the present implementation) second placement sections 15A to 15E are arranged along the one direction. For example, a first transport vehicle 40A that has received a conveyed object F processed by the processing device 11 from the third transfer section 11A delivers the conveyed object F on a priority basis to the second placement section 15A that is arranged upstream in the one direction. A second transport vehicle 40B receives a conveyed object F on a priority basis from the second placement section 15A that is arranged upstream in the one direction.

As depicted in FIG. 3, the second transfer section 15 is arranged below the second transport vehicle 40B traveling on the approach section 30B, and is arranged beside the first transport vehicle 40A traveling on the lower intra-bay route 20A. Herein, the first transport vehicle 40A and the second transport vehicle 40B travel in the same direction respectively on the lower intra-bay route 20A and the approach section 30B that are arranged parallel to each other when viewed in plan view.

Figure 5:
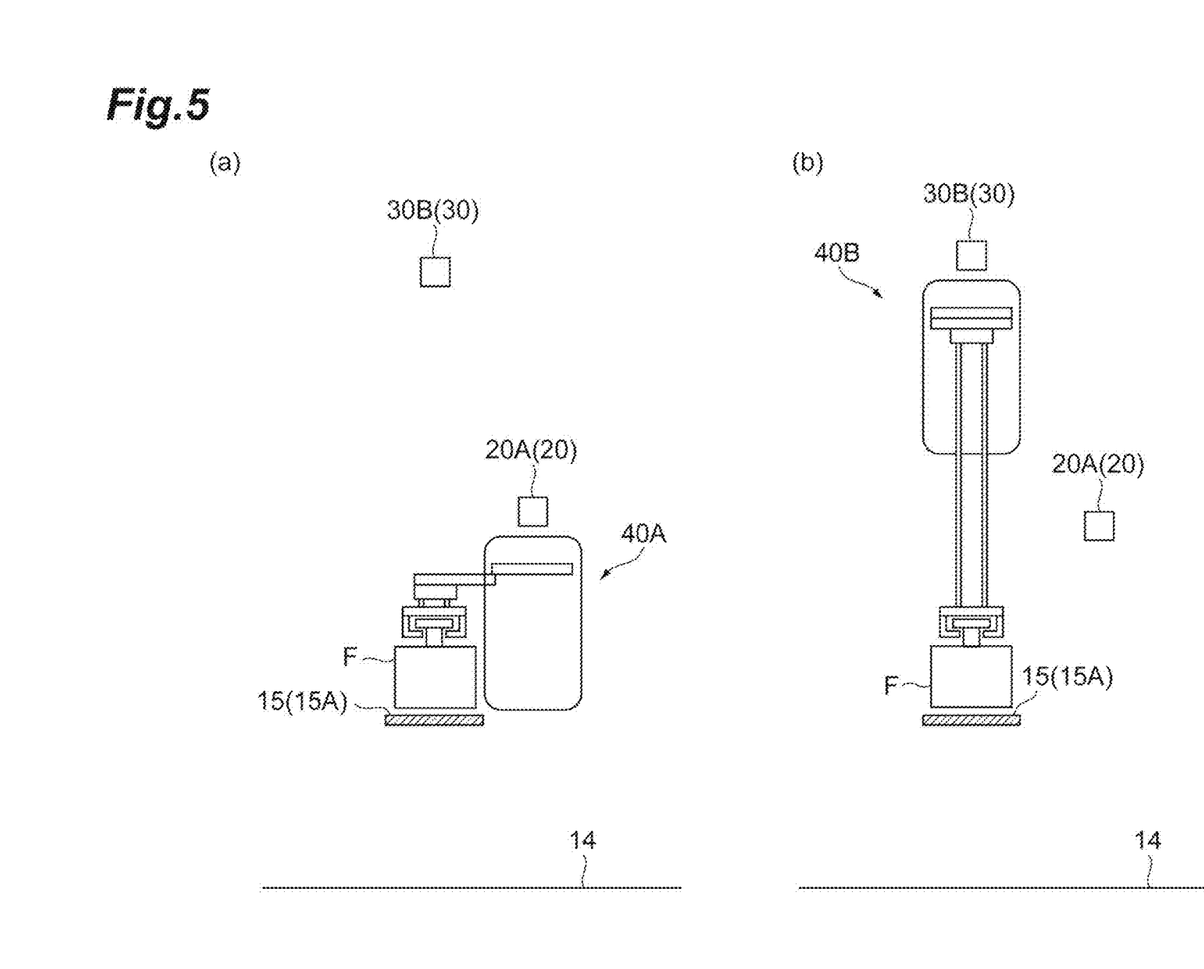
FIG. 5(a) is a front view illustrating a method for transferring a conveyed object in a second transfer section performed by the second transport vehicle.
FIG. 5(b) is a front view illustrating a method for transferring a conveyed object in the second transfer section performed by the first transport vehicle.

The following describes a method for transferring a conveyed object F from a first transport vehicle 40A to a second transport vehicle 40B. Specifically, as depicted in FIG. 5(a), a first transport vehicle 40A traveling on the lower intra-bay route 20A stops beside the second transfer section 15 (e.g., the second placement section 15A). The first transport vehicle 40A drives the lateral drive 41 and the hoist drive unit 43 described later in detail (see FIG. 6) to transfer a conveyed object F onto the second placement section 15A. This completes delivery of the conveyed object F from the first transport vehicle 40A to the second transfer section 15.

Subsequently, as depicted in FIG. 5(b), a second transport vehicle 40B traveling on the approach section 30B stops above the second transfer section 15 (e.g., the second placement section 15A). The second transport vehicle 40B drives the hoist drive unit 43 described later in detail to receive the conveyed object F from the second placement section 15A. This completes delivery of the conveyed object F from the second transfer section 15 to the second transport vehicle 40B. In other words, delivery of the conveyed object F from the first transport vehicle 40A to the second transport vehicle 40B is completed.

Figure 6:
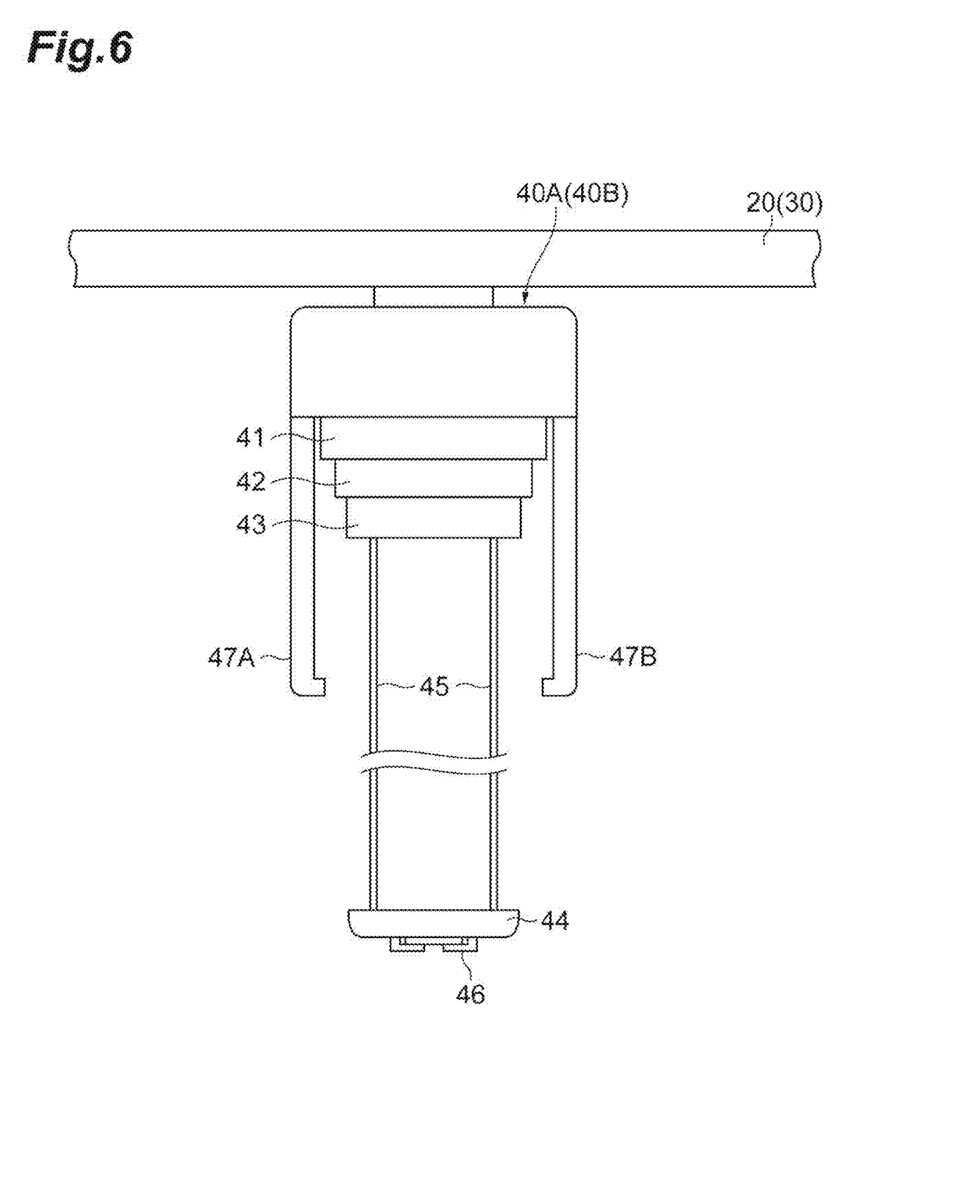
FIG. 6 is a side view illustrating one example of a configuration of each first transport vehicle and each second transport vehicle in FIG. 1.

The following describes a configuration of each first transport vehicle 40A and each second transport vehicle 40B that respectively travel on the lower track 20 and the upper track 30. The first transport vehicle 40A and the second transport vehicle 40B are each an overhead hoist transport (OHT) configured to grip and convey a conveyed object F being suspended. As depicted in FIG. 6, the first transport vehicle 40A and the second transport vehicle 40B each include the lateral drive 41, a θ drive 42, the hoist drive unit 43, and a hoist carriage 44.

The lateral drive 41 is a unit configured to move the θ drive 42, the hoist drive unit 43, and the hoist carriage 44 in a direction orthogonal to the traveling rails (the lower track 20 and the upper track 30) in a horizontal plane. The θ drive 42 is a unit configured to rotate the hoist drive unit 43 and the hoist carriage 44 in a horizontal plane.

The hoist drive unit 43 is a unit configured to raise and lower the hoist carriage 44 by winding up and paying out belts 45. As the belts 45 in the hoist drive unit 43, appropriate suspending members such as wires and ropes may be used.

A lower portion of the hoist carriage 44 is provided with a chuck 46 configured to grip a conveyed object F. A front frame 47A and a rear frame 47B respectively provided to the front and the rear of each of the first transport vehicle 40A and the second transport vehicle 40B are configured to advance and retract fall-preventing pieces (not depicted) under a conveyed object F, thereby preventing the conveyed object F from falling.

As depicted in FIG. 1, the system controller 80 is a unit configured to perform various types of control processes in the entire transport vehicle system 1, and is an electronic control unit including a central processing unit (CPU), a read only memory (ROM), and a random access memory (RAM).

In the present implementation, the system controller 80 performs, for example, control of causing a second transport vehicle 40B to deliver a conveyed object F on a priority basis to a first placement section 13A that is arranged upstream in the one direction, and control of causing a first transport vehicle 40A to receive the conveyed object F on a priority basis from the first placement section 13A that is arranged upstream in the one direction. The system controller 80 also performs, for example, control of causing a first transport vehicle 40A to deliver a conveyed object F on a priority basis to a second placement section 15A that is arranged upstream in the one direction, and control of causing a second transport vehicle 40B to receive the conveyed object F on a priority basis from the second placement section 15A that is arranged upstream in the one direction.

The following describes functional effects of the transport vehicle system 1 according to the implementation above. With the transport vehicle system 1 according to the implementation, each first transport vehicle 40A can be used for conveyance within an area and each second transport vehicle 40B can be used for conveyance between areas. Thus, a situation in which the first transport vehicle 40A travels between areas and the second transport vehicle 40B travels within an area can be prevented.

In other words, the respective roles of the first transport vehicle 40A and the second transport vehicle 40B can be divided, whereby the number of first transport vehicles 40A traveling in each area can be always kept constant without being increased or reduced. This enables the first transport vehicles 40A and the second transport vehicles 40B to efficiently travel, and thus, congestion can be relieved. With the transport vehicle system 1 according to the implementation, during traveling on each lower intra-bay route 20A in the one direction, each first transport vehicle 40A receives a conveyed object F from a second transport vehicle 40B in the corresponding first transfer section 13, delivers the conveyed object F in one of the corresponding third transfer sections 11A, also receives a conveyed object F in the third transfer section 11A, and delivers the conveyed object F to the second transport vehicle 40B in the corresponding second transfer section 15.

Similarly, during traveling on the corresponding approach section 30B in the one direction, the second transport vehicle 40B delivers a conveyed object F to the first transport vehicle 40A in the first transfer section 13, and receives the conveyed object F from the first transport vehicle 40A in the second transfer section 15. During a series of traveling processes, the first transport vehicle 40A and the second transport vehicle 40B repeat operations of receiving a conveyed object F and delivering the conveyed object F as described above, which enables efficient conveyance for the first transport vehicle 40A and the second transport vehicle 40B. Consequently, conveying capability can be improved, and congestion of transport vehicles can be relieved.

In the transport vehicle system 1 according to the implementation, in the first transfer section 13 and the second transfer section 15, a conveyed object F is transferred between the first transport vehicle 40A and the second transport vehicle 40B respectively traveling on the lower intra-bay route 20A and the approach section 30B that are arranged parallel to each other. Thus, the first transfer section 13 and the second transfer section 15 in which a conveyed object F can be transferred from the first transport vehicle 40A and the second transport vehicle 40B can be easily arranged.

In the transport vehicle system 1 according to the implementation, the first transfer section 13 and the second transfer section 15 are each arranged below the second transport vehicle 40B traveling on the approach section 30B, and are each arranged beside the first transport vehicle 40A traveling on the lower intra-bay route 20A, and thus space for an area in which the entire transport vehicle system 1 is installed can be reduced. The first transport vehicle 40A can transfer a conveyed object F from the first transfer section 13 and to the second transfer section 15 by simple control of only laterally feeding of the corresponding hoist carriage. The second transport vehicle 40B can transfer the conveyed object F to the first transfer section 13 and from the second transfer section 15 by simple control of only raising and lowering the hoist carriage. Thus, a time required for transferring the conveyed object F can be shortened.

In the transport vehicle system 1 according to the implementation, the first placement sections 13A, 13B, 13C, 13D, and 13E are arranged in the first transfer section 13, the second transport vehicle 40B delivers a conveyed object F on a priority basis to the first placement section 13A that is arranged upstream in the one direction, and the first transport vehicle 40A receives the conveyed object on a priority basis from the first placement section 13A that is arranged upstream in the one direction. Thus, the second transport vehicle 40B can deliver a conveyed object F to the first transfer section 13 earlier, and the first transport vehicle 40A can receive the conveyed object F from the first transfer section 13 earlier. Consequently, the second transport vehicle 40B has an increasing chance of delivering the conveyed object F and the first transport vehicle 40A has an increasing chance of receiving the conveyed object F, and thus the conveyed object F can be efficiently transferred from the second transport vehicle 40B to the first transport vehicle 40A.

In the transport vehicle system 1 according to the implementation, the second placement sections 15A, 15B, 15C, 15D, and 15E are arranged in the second transfer section 15, the first transport vehicle 40A delivers a conveyed object F on a priority basis to the second placement section 15A that is arranged upstream in the one direction, and the second transport vehicle 40B receives the conveyed object on a priority basis from the second placement section 15A that is arranged upstream in the one direction.

Thus, the first transport vehicle 40A can deliver the conveyed object F to the second transfer section 15 earlier, and the second transport vehicle 40B can receive the conveyed object F from the second transfer section 15 earlier. Consequently, the first transport vehicle 40A has an increasing chance of delivering the conveyed object F and the second transport vehicle 40B has an increasing chance of receiving the conveyed object F. Thus, the conveyed object F can be efficiently transferred from the first transport vehicle 40A to the second transport vehicle 40B.

In the foregoing, one implementation of the example implementation(s) has been described. However, the example implementation(s) is not limited to the implementation, and various modifications can be made without departing from the gist of the invention.

<Modification 1>

In the transport vehicle system 1 according to the implementation, an example has been described in which each first transport vehicle 40A traveling on the lower track 20 and each second transport vehicle 40B traveling on the upper track 30 both include the lateral drive 41, that is, include a mechanism configured to laterally feed a conveyed object F in a direction orthogonal to the track. However, in the present implementation in which each first transfer section 13 and the corresponding second transfer section 15 are each arranged below the second transport vehicle 40B traveling on the upper track 30, the second transport vehicle 40B does not have to include the lateral drive 41. In this case, the transport vehicle system 1 can be configured at low cost.

<Modification 2>

Figure 7:
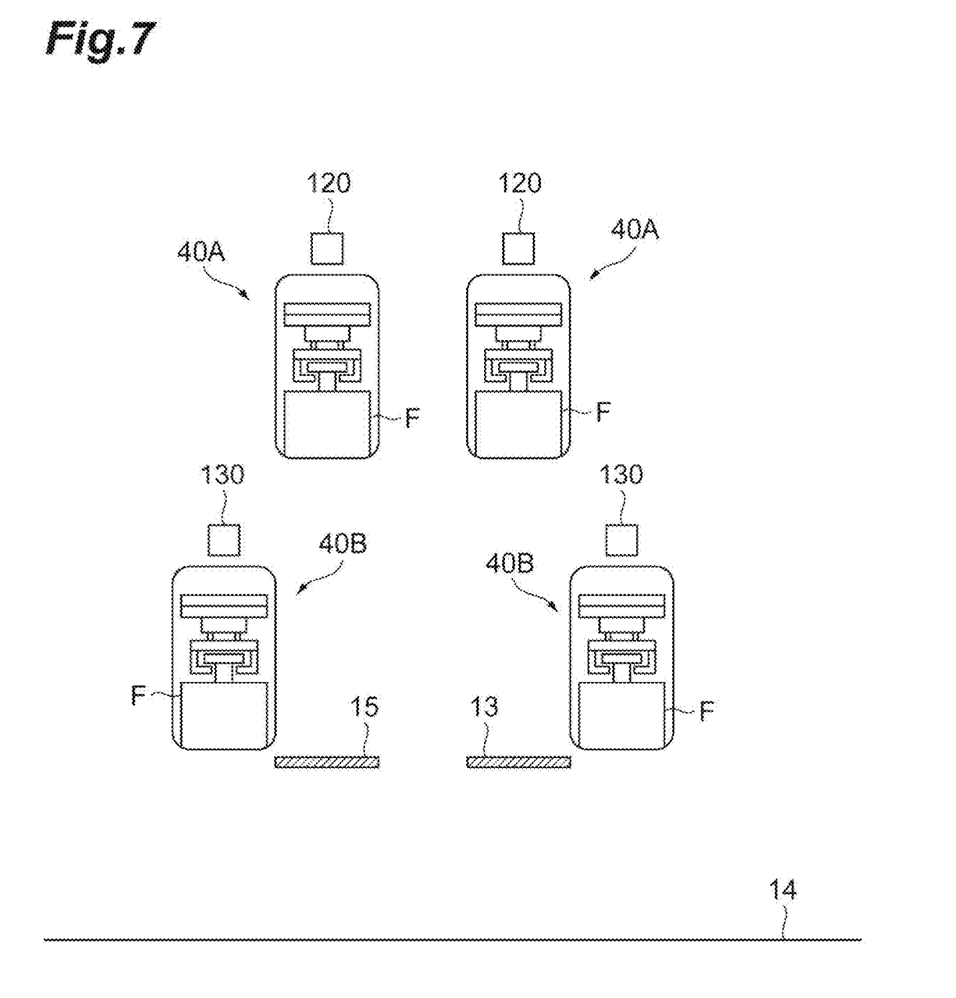
FIG. 7 is a front view of a transport vehicle system according to a modification 2 when viewed from the line III-III in FIG. 1.

Instead of the configuration of the implementation or the modification, for example, as depicted in FIG. 7, the first transfer section 13 and the second transfer section 15 may be each arranged beside the second transport vehicle 40B traveling on a second track 130 connecting between a plurality of areas 10, and may each arranged below the first transport vehicle 40A on a first track 120 circling in each area 10. In this case, if the third transfer sections 11A are each arranged below the first transport vehicle 40A traveling on the first track 120, the first transport vehicle 40A does not have to include the lateral drive 41. With this configuration, the transport vehicle system 1 can be configured at low cost.

<Modification 3>

Figure 8:
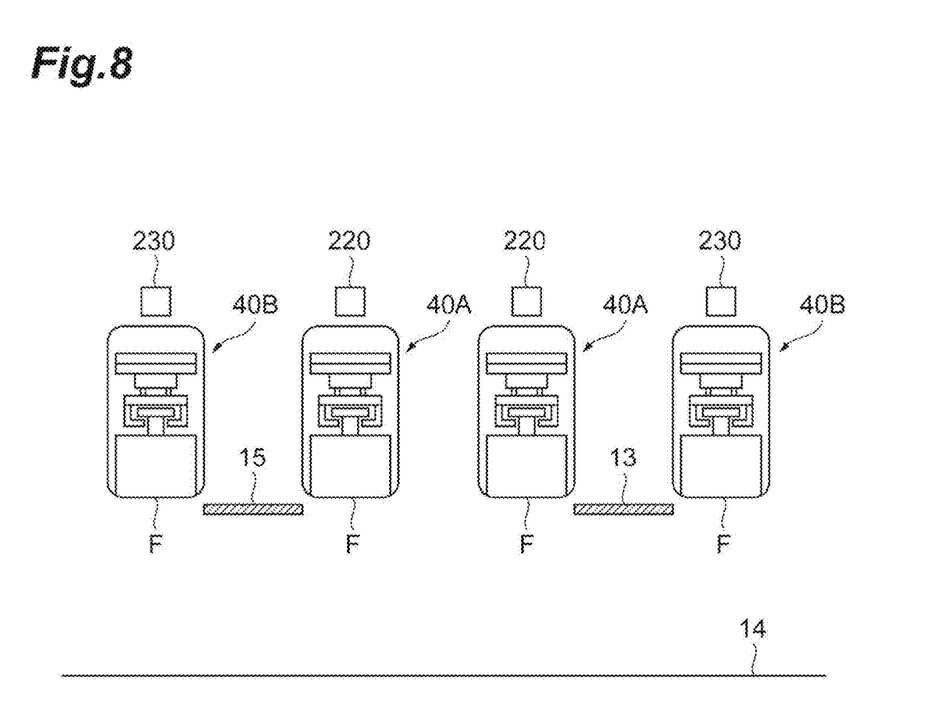
FIG. 8 is a front view of a transport vehicle system according to a modification 3 when viewed from the line III-III in FIG. 1.

Instead of the configuration of the implementation or the modifications, for example, as depicted in FIG. 8, the first transfer section 13 and the second transfer section 15 may be each arranged beside the second transport vehicle 40B traveling on a second track 230 connecting between the areas 10 and the first transport vehicle 40A traveling on a first track 220 circling in each area 10.

REFERENCE SIGNS LIST

1 . . . transport vehicle system, 10 . . . area, 10A . . . first region, 10B . . . second region, 11 . . . processing device, 11A . . . third transfer section, 13 . . . first transfer section, 13A to 13E . . . first placement section, 15 . . . second transfer section, 15A to 15E . . . second placement section, 20 . . . lower track (first track), 20A . . . lower intra-bay route, 20B . . . lower inter-bay route, 20C . . . connecting route, 30 . . . upper track (second track), 30A . . . upper inter-bay route, 30B . . . approach section, 40A . . . first transport vehicle, 40B . . . second transport vehicle, 80 . . . system controller, 120, 220 . . . first track, 130, 230 . . . second track, F . . . conveyed object.

The invention claimed is:

1. A transport vehicle system, comprising:
a first track forming a circuit track that circles in an area comprising one of a plurality of areas;
a first transport vehicle configured to travel on the first track in one direction;
a second track positioned between, and connecting to, the areas;
a second transport vehicle configured to travel on the second track in one direction;
a first transfer section onto which a conveyed object is delivered from the second transport vehicle, and from which the conveyed object is received by the first transport vehicle; and
a second transfer section onto which the conveyed object is delivered from the first transport vehicle, and from which the conveyed object is received by the second transport vehicle, wherein
the area includes a first region and a second region,
the first track is arranged across the first region and the second region,
the first transfer section and the second transfer section are arranged in the first region, and a third transfer section, in which the conveyed object can be transferred to or from the first transport vehicle, is arranged in the second region,
the first track in the first region is arranged such that the first transport vehicle passes by the second transfer section and the first transfer section in this order, in a traveling direction of the first transport vehicle, and
the second track in the first region is arranged such that the second transport vehicle passes by the first transfer section and the second transfer section in this order, in a traveling direction of the second transport vehicle
wherein the third transfer section is arranged between the first transfer section and the second transfer section in a direction extending along the first track.

2. The transport vehicle system according to claim 1, wherein in at least one of the first transfer section and the second transfer section, the conveyed object is transferred between the first transport vehicle and the second transport vehicle respectively traveling on the first track and the second track that are arranged substantially parallel to each other.

3. The transport vehicle system according to claim 1, wherein the first transport vehicle and the second transport vehicle respectively travel in the same direction on the first track and the second track that are arranged parallel to each other.

4. The transport vehicle system according to claim 1, wherein at least one of the first transfer section and the second transfer section is arranged below one of the first track and the second track and beside the other of the first track and the second track.

5. The transport vehicle system according to claim 1, wherein at least one of the first transfer section and the second transfer section is arranged below the second track and beside the first track.

6. The transport vehicle system according to claim 1, wherein
a plurality of first placement sections are arranged in the first transfer section,
the second transport vehicle delivers the conveyed object on a priority basis to one of the first placement sections that is arranged upstream in the one direction, and
the first transport vehicle receives the conveyed object on a priority basis from one of the first placement sections that is arranged upstream in the one direction.

7. The transport vehicle system according to claim 1, wherein
a plurality of second placement sections are arranged in the second transfer section,
the first transport vehicle delivers the conveyed object on a priority basis to one of the second placement sections that is arranged upstream in the one direction, and
the second transport vehicle receives the conveyed object on a priority basis from one of the second placement sections that is arranged upstream in the one direction.

8. The transport vehicle system according to claim 1, wherein in the second region, processing devices configured to perform at least one of identical processes and similar processes are arranged along the first track, and the conveyed object is transferred between the first transport vehicle and each processing device via the third transfer section.

9. A transport vehicle system, comprising:
a first track forming a circuit track that circles in an area comprising one of a plurality of areas;
a first transport vehicle configured to travel on the first track in one direction;
a second track positioned between, and connecting to, the areas;
a second transport vehicle configured to travel on the second track in one direction;
a first transfer section onto which a conveyed object is delivered from the second transport vehicle, and from which the conveyed object is received by the first transport vehicle; and
a second transfer section onto which the conveyed object is delivered from the first transport vehicle, and from which the conveyed object is received by the second transport vehicle, wherein
the area includes a first region and a second region,
the first track is arranged across the first region and the second region,
the first transfer section and the second transfer section are arranged in the first region, and a third transfer section, in which the conveyed object can be transferred to or from the first transport vehicle, is arranged in the second region, the first track in the first region is arranged such that the first transport vehicle passes by the second transfer section and the first transfer section in this order, in a traveling direction of the first transport vehicle, and the second track in the first region is arranged such that the second transport vehicle passes by the first transfer section and the second transfer section in this order, in a traveling direction of the second transport vehicle, wherein the first transport vehicle and the second transport vehicle respectively travel in the same direction on the first track and the second track that are arranged parallel to each other.

10. The transport vehicle system according to claim 9, wherein the third transfer section is arranged between the first transfer section and the second transfer section in a direction extending along the first track.

11. The transport vehicle system according to claim 9, wherein in at least one of the first transfer section and the second transfer section, the conveyed object is transferred between the first transport vehicle and the second transport vehicle respectively traveling on the first track and the second track that are arranged substantially parallel to each other.

12. The transport vehicle system according to claim 9, wherein at least one of the first transfer section and the second transfer section is arranged below one of the first track and the second track and beside the other of the first track and the second track.

13. The transport vehicle system according to claim 9, wherein at least one of the first transfer section and the second transfer section is arranged below the second track and beside the first track.

14. The transport vehicle system according to claim 9, wherein a plurality of first placement sections are arranged in the first transfer section, the second transport vehicle delivers the conveyed object on a priority basis to one of the first placement sections that is arranged upstream in the one direction, and the first transport vehicle receives the conveyed object on a priority basis from one of the first placement sections that is arranged upstream in the one direction.

15. The transport vehicle system according to claim 9, wherein a plurality of second placement sections are arranged in the second transfer section, the first transport vehicle delivers the conveyed object on a priority basis to one of the second placement sections that is arranged upstream in the one direction, and the second transport vehicle receives the conveyed object on a priority basis from one of the second placement sections that is arranged upstream in the one direction.

16. The transport vehicle system according to claim 9, wherein in the second region, processing devices configured to perform at least one of identical processes and similar processes are arranged along the first track, and the conveyed object is transferred between the first transport vehicle and each processing device via the third transfer section.

* * * * *